United States Patent [19]
Kobayashi et al.

[11] Patent Number: 6,072,371
[45] Date of Patent: *Jun. 6, 2000

[54] QUENCHABLE VCO FOR SWITCHED BAND SYNTHESIZER APPLICATIONS

[75] Inventors: Kevin W. Kobayashi; Duncan M. Smith; Aaron K. Oki; Arvind K. Sharma, all of Torrance; Barry R. Allen, Redondo Beach, all of Calif.

[73] Assignee: TRW Inc., Redondo Beach, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/876,275

[22] Filed: Jun. 16, 1997

[51] Int. Cl.$^7$ ................................ H03B 5/00; H03B 5/12
[52] U.S. Cl. ..................... 331/49; 331/179; 331/117 D; 331/117 R
[58] Field of Search ................................ 331/109, 117 D, 331/108 C, 179, 49, 48, 177 R, 172, 117 R

[56] References Cited

U.S. PATENT DOCUMENTS

| | | | |
|---|---|---|---|
| 4,688,004 | 8/1987 | Hirai et al. ................................. | 331/49 |
| 4,755,772 | 7/1988 | Khanna ..................................... | 331/109 |
| 5,686,864 | 11/1997 | Martin et al. ............................ | 331/1 A |
| 5,852,384 | 12/1998 | Sakakura et al. ........................ | 331/48 |

FOREIGN PATENT DOCUMENTS

| | | |
|---|---|---|
| 50-26266 | 8/1975 | Japan . |
| 60-137104 | 7/1985 | Japan . |
| 01173908 | 7/1989 | Japan . |
| 06140836 | 5/1994 | Japan . |
| 07249940 | 9/1995 | Japan . |

OTHER PUBLICATIONS

K.K. Agarwal, "Dielectric Resonator Oscillators Using GaAs/(Ga,Al)As Heterojunction Bipolar Transistors," *1986 IEEE MTT Symp. Dig.*, Baltimore, MD, pp. 95–98.

N. Hayama, et al., "A Low–Noise Ku–Band AlGaAs/GaAs HBT Oscillator," *1988 IEEE MTT Symp. Dig.*, New York, NY, pp. 679–682.

G. Dietz, "A 10–14 Ghz Quenchable MMIC Oscillator," *1991 IEEE MTT Symp. Dig.*, Boston, MA, pp. 23–26.

*Primary Examiner*—Arnold Kinkead
*Attorney, Agent, or Firm*—Michael S. Yatsko

[57] ABSTRACT

A quenchable VCO that is adapted to be used in switched band synthesizer applications. The VCO may be formed from a heterojunction bipolar transistor (HBT) in a common collector configuration. A quenching circuit which includes a p-i-n diode, is electrically coupled in series with the collector of the HBT. The p-i-n diode is adapted to be monolithically integrated with the HBT. Since the p-i-n diode is electrically connected to the collector of the HBT, as opposed to the base and emitter terminals of the HBT, which forms the main oscillator feedback loop, the Q-factor of the p-i-n diode will have relatively less loading on the phase noise of the HBT oscillator. Moreover, since the p-i-n diode is isolated from the base-emitter junction, the configuration will result in reduced frequency pulling and generation of spurious oscillation and transient effects due to the switching of the p-i-n diode quenched circuit. The use of a p-i-n diode for quenching of VCO also provides other inherent advantages over other types of semi-conductor switches, such as FET, Schottky diodes, PN diodes for quenchable VCO applications because p-i-n diodes are relative insensitive to RF and noise modulation. Because the p-i-n diode can be constructed from existing HBT collector-base MBE epitaxy layers, the quenching circuit can be manufactured relatively inexpensively.

9 Claims, 7 Drawing Sheets

QUENCHABLE VCO FOR SWITCHED BAND SYNTHESIZER APPLICATIONS

This invention was made with federal government support under Contract No. N62269-93-C-0026. The federal government, therefore, has certain rights to the invention.

BACKGROUND OF THE INVENTION

1. Technical Field

The present invention relates to a quenchable voltage controlled oscillator (VCO) for a switched band synthesizer and more particularly to a VCO formed, for example, from a heterojunction bipolar transistors (HBT) and a VCO quenching circuit for unquenching a selected VCO and quenching the unselected VCOs; the VCO quenching circuit formed from a p-i-n diode electrically coupled in series with the collector of the HBT, which can be monolithically integrated with the HBT, to provide better performance than known quenchable VCO switchband synthesizer applications.

2. Description of the Prior Art

Heterojunction bipolar transistor (HBT) device technology is known for low phase noise VCO applications due to the low 1/f noise of such devices relative to MESFETs at microwave to millimeter-wave cutoff frequencies. Known HBT VCO devices have superior phase noise performance compared to MESFET VCOs and comparable performance to silicon based VCOs at the C-Ku-band frequencies. However, above such frequencies, HBT technology is preferred for low phase noise VCO applications because of the superior frequency operating capability of HBT based devices compared to the silicon based BJTs and lower device phase noise compared to MESFETs and HEMT technologies as generally described in "Dielectric Resonator Oscillators Using GaAs/(Ga,Al)As Heterjunction Bipolar Transistors," by K. K. Agarwal, 1986 *IEEE MTT Symp. Dig.*, Baltimore, Md., pp. 95–98; and "A Low-Noise Ku-Band A1GaAs/GaAs HBT Oscillator," by N. Hayama, et al., 1988 *MTT Symp. Dig.*, New York, N.Y., pp. 679–682 hereby incorporated by reference. However, for relatively high performance synthesizer applications, phase noise performance over a relatively wide tuning bandwidth provides relatively unacceptable performance. In order to meet the low phase noise and frequency tuning bandwidth requirements, often several VCOs are used which cover several narrower overlapping tuning bandwidths forming a switched band synthesizer. With such a configuration, the narrower VCO tuning bandwidths provide a higher Q in order to achieve lower phase noise.

A relatively important consideration in such a switched band synthesizer application is the use of a VCO quenching circuit which can switch relatively fast and clean, generating little or no switching transient in order to enable the VCOs to phase lock relatively quickly with minimal degradation of the phase noise and pulling performance of the VCO. As setforth in a "10–14 GHz Quenchable MMIC Oscillator", by G. Dietz, et al., 1991 *IEEE MTT Symp. Dig.*, Boston, Mass., pp. 23–26, a known quenchable VCO using MESFET techniques which includes a passive FET switch for providing oscillation quenching is disclosed. This device is illustrated in FIG. 1. Unfortunately, there are several drawbacks to using such a FET switch in the quenching circuit illustrated in FIG. 1. For example, as shown in FIG. 1, the FET switch is disposed between the ground and the source of the FET oscillator which makes it relatively susceptible to frequency pulling due to the active capacitive loading on the source of the oscillating FET of the switch-FET drain. Moreover, as shown, the FET switch is configured in series with the gate-to-source junction, a critical device junction which controls the device transconductance, making the oscillator phase performance very sensitive to the Q of the FET switch. In addition, the use of a noisy FET switch device is relatively more susceptible to VCO carrier modulation than other devices, such as p-i-n diodes thus potentially generating unwanted transients and oscillations. Such spurious effects are relatively more pronounced at higher frequencies due to the nonlinear characteristics of FET-based switched.

SUMMARY OF THE INVENTION

It is an object of the present invention to solve various problems in the prior art.

It is yet another object of the present invention to provide a quenchable VCO which provides relatively better performance than such other known circuits.

It is yet another object of the present invention to provide a switched band synthesizer formed from a plurality of VCOs with monolithically integrated quenching circuits.

Briefly, the present invention relates to a quenchable VCO that is adapted to be used in switched band synthesizer applications. The VCO may be formed from a heterojunction bipolar transistor (HBT) in a common collector configuration. A quenching circuit which includes a p-i-n diode, is electrically coupled in series with the collector of the HBT. The p-i-n diode is adapted to be monolithically integrated with the HBT. Since the p-i-n diode is electrically connected to the collector of the HBT, as opposed to the base and emitter terminals of the HBT, which forms the main oscillator feedback loop, the Q-factor of the p-i-n diode will have relatively less loading on the phase noise of the HBT oscillator. Moreover, since the p-i-n diode is isolated from the base-emitter junction, the configuration will result in reduced frequency pulling and generation of spurious oscillation and transient effects due to the switching of the p-i-n diode quenched circuit. The use of a p-i-n diode for quenching of VCO also provides other inherent advantages over other types of semi-conductor switches, such as FET, Schottky diodes, PN diodes for quenchable VCO applications because p-i-n diodes are relatively insensitive to RF and noise modulation. Because the p-i-n diode can be constructed from existing HBT collector-base MBE epitaxy layers, the quenching circuit can be manufactured relatively inexpensively.

DESCRIPTION OF THE DRAWINGS

These and other objects of the present will be readily understood with reference to the following specification and attached drawings wherein:

FIG. 5 is a small circuit model of the p-i-n diode illustrated in FIG. 4 in a condition when the p-i-n diode is on.

FIG. 6 is a graphical illustration of the operation of the circuit of FIG. 4 in a condition when the p-i-n diode is on.

DETAILED DESCRIPTION

Figure 1:
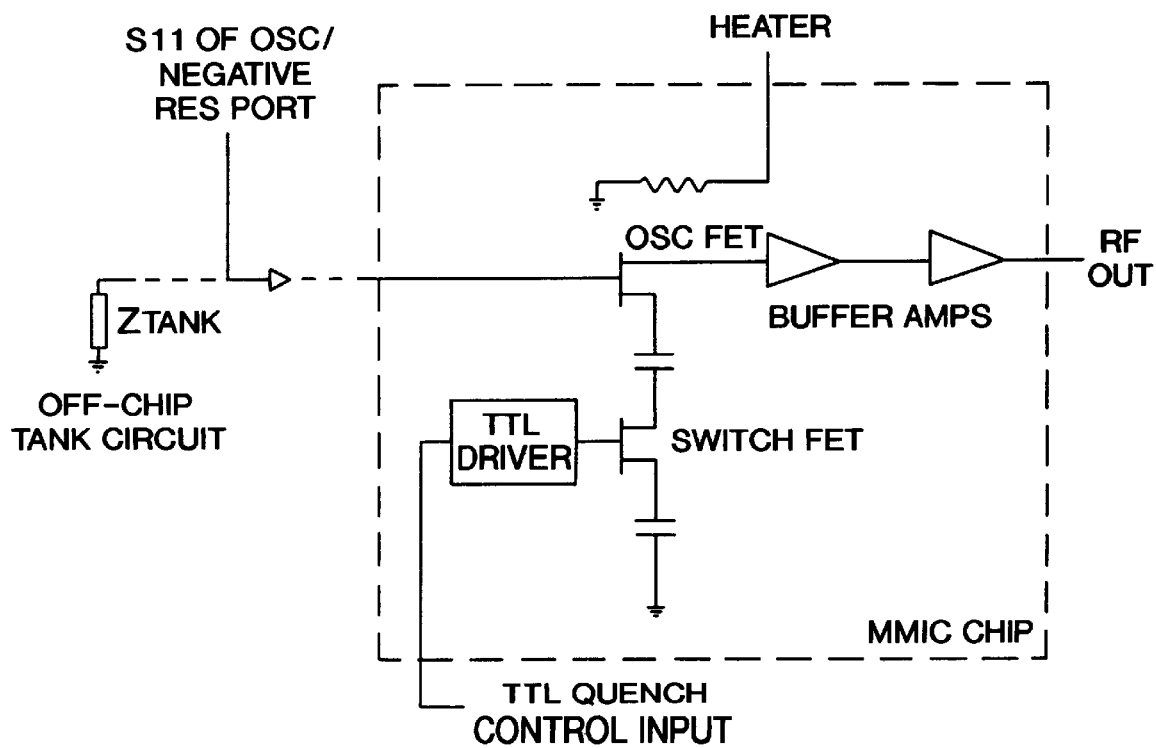
FIG. 1 is a schematic diagram of a known VCO quenched circuit.
Figure 2:
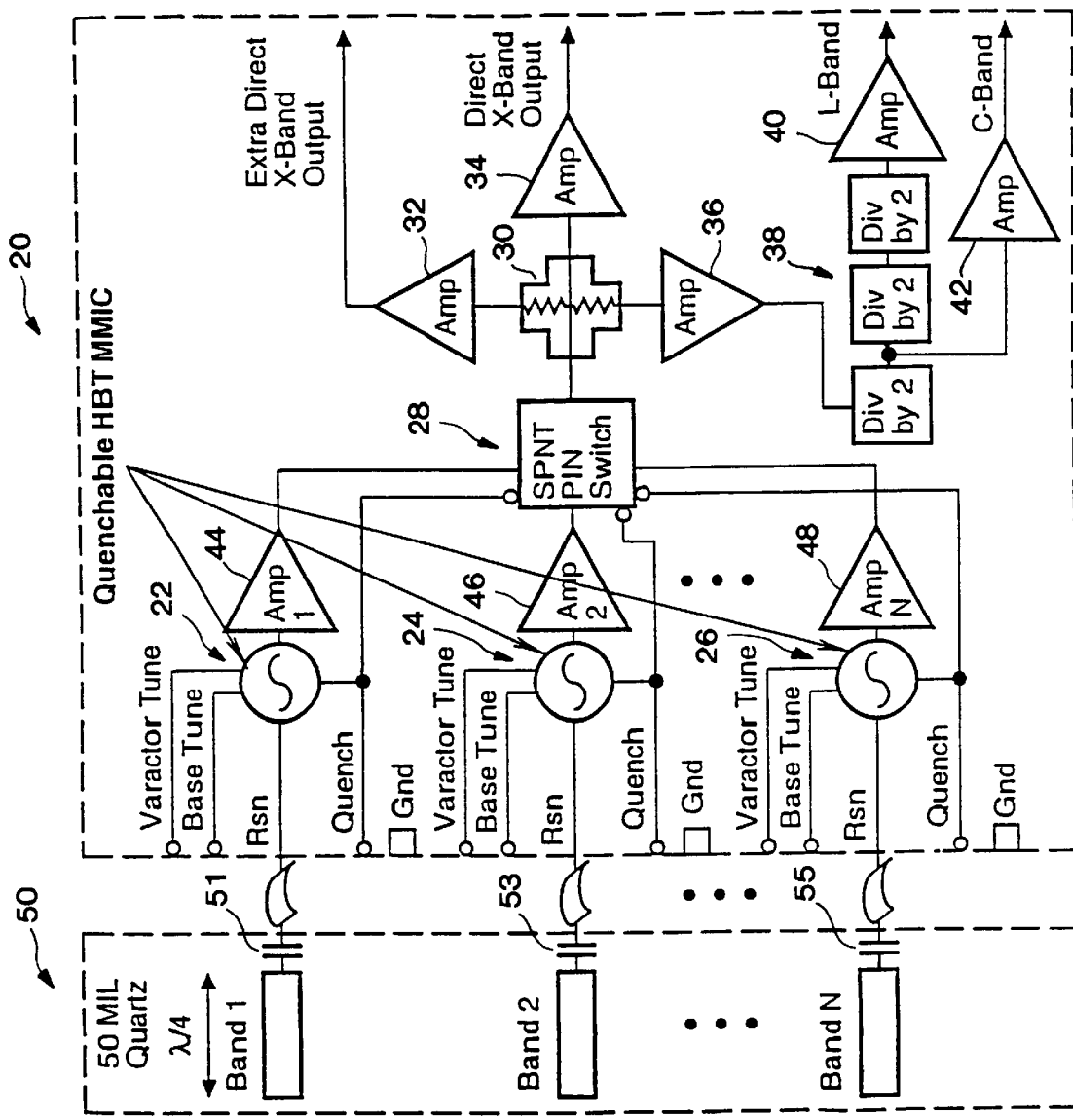
FIG. 2 is a schematic diagram of a switched band synthesizer circuit which incorporates the quenchable VCO circuit in accordance with the present invention.

A switched band synthesizer which incorporates the quenchable VCO is accordance with the present invention is illustrated in FIG. 2. The switched band synthesizer circuit 20 includes a plurality quenchable voltage controlled oscillators (VCO) 22, 24 and 26 covering several narrow overlapping tuning bands, band 1, band 2 up to band N. The bands, band 1, band 2 and band N, are selected by an N-way switch 28 discussed in more detail below. The VCOs 22, 24 and 26 may be formed with integrated quenching circuits that enable the N-way switch 28 to unquench a selected band and simultaneously connect the selected VCO to the output while quenching unselected VCOs 22, 24 and 26 in order to avoid thermal drift due to the powering on and powering off of transistors of the selected and unselected VCOs 22, 24 and 26.

The N-way switch 28 couples the selected band to a power splitter 30, for example. The output of the power splitter is coupled to buffer amps 32, 34 and 36. Depending on the desired frequency bands, the buffer amps may be coupled to frequency pre-scaler/frequency divider circuits, generally identified with the reference numeral 38 and additional buffer amps 40, 42 to provide the desired frequency bands. In addition, a buffer amp 44, 46 and 48 may be coupled between each of the quenchable VCOs 22, 24 and 26 and the N-way switch 28. An important aspect of the invention is that the buffer amps 32, 34, 36, 40, 42, 44, 46 and 48, the power splitter 30, the frequency prescaler/frequency divider circuits 38 as well as the N-way switch 28 may be monolithically integrated with the quenchable VCOs 22, 24 and 25 using GaAs or InP HBT Technology.

An off-chip microstrip open stub resonator, generally identified with the reference numeral 50, fabricated on a, for example, 50 mil low dielectric quartz substrate, can be integrated with the MMIC 20 to provide a relatively high resonator Q. The resonator 50 can be modelled as a simple lumped element series L-C resonator. The open stub resonator 50 for each band may be formed to be 5 mil wide and slightly over a quarter-wave in length to provide a relatively high inductive reactive impedance slope to the MMIC 20. The open stub resonator 50 may be coupled to the base terminal of the quenchable VCO circuits 22, 24 and 26, for example, by way of a series of off-chip 0.2 pF Alpha coupling capacitances 51, 53, 55 and an on-chip 0.25 pF coupling capacitor. As is known by those of ordinary skill in the art, the effective coupling capacitance is relatively critical in determining the effective loaded Q of the resonator 50.

Figure 3:
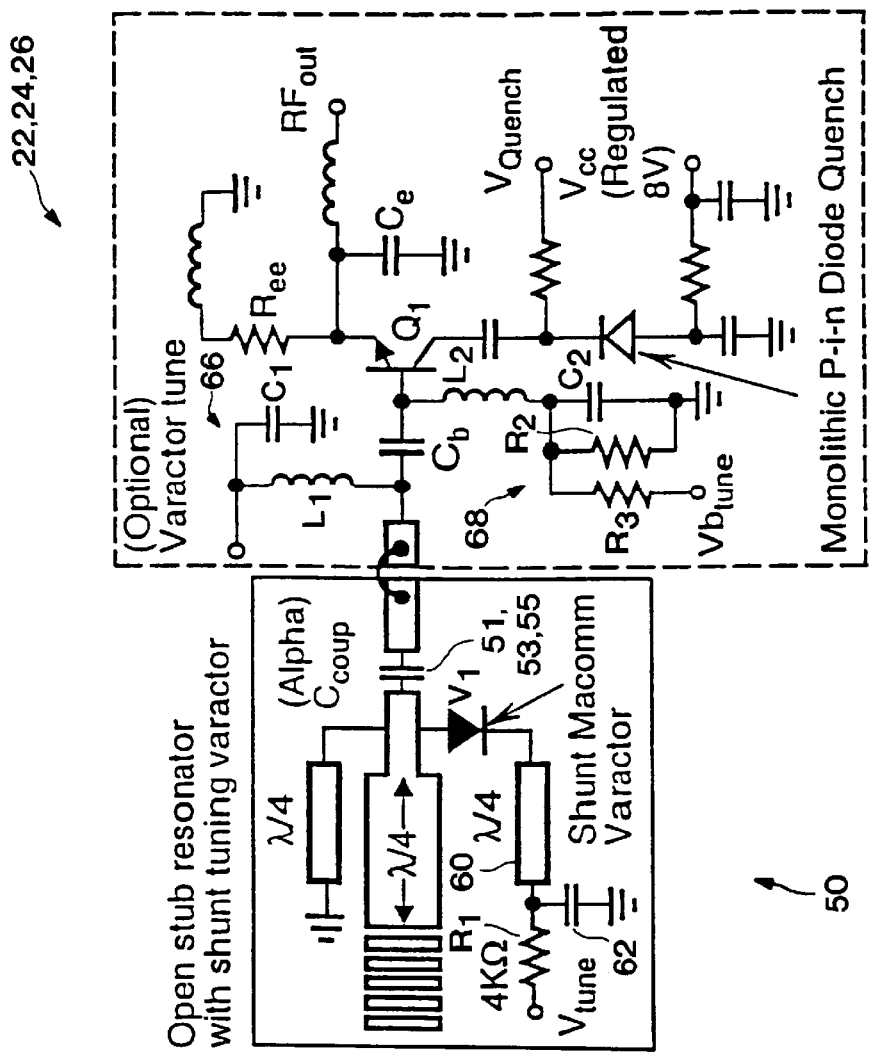
FIG. 3 is a schematic diagram of the quenchable VCO in accordance with the present invention.

Voltage controlled frequency tuning of the VCOs 22, 24 and 26 can be provided by discrete commercially available 0.6 pF shunt varactor diodes V1 (FIG. 3). The shunt varactor diode V1 is known to have relatively lower phase noise with modest tuning bandwidths compared to series varactor configurations. With such a shunt configuration of the varactor, a tuning bandwidth and associated phase noise performance can be adjusted by placing the varactor V1 at various position along the resonator line.

The quenchable VCO 22, 24 and 26 in accordance with the present invention is illustrated in FIG. 3. As shown, the VCO 22, 24 and 26 may be configured in a common collector configuration. In particular, in one embodiment, a heterojunction bipolar transistor (HBT) Q1 is utilized for the VCO in a common collector configuration. The active HBT VCO circuit may employ a 2×10 $\mu m^2$ quad—emitter common collector HBT, normally biased for 8 mA. The common collector configuration provides for broadband instability characteristics at microwave and millimeter-wave frequencies. A shunt capacitor Ce, coupled to the emitter of HBT Q1, may be used to tune the region of negative resistance looking into the base of the HBT Q1. An emitter degeneration resistor Ree may be used to help bias the HBT Q1 as well as inhibit up-conversion of low frequency noise onto the skirts of the desired RF tone.

Quenching of the VCO is provided by a p-i-n diode, connected in series with the collector of the HBT Q1. Connecting the p-i-n diode between the collector of the HBT Q1 and RF ground provides enhanced performance relative to known quenched circuits. In particular, since the p-i-n diode loads down the collector terminal and not the base and emitter terminals, forming the main oscillator loop, the Q factor of the p-i-n diode will have less loading impact on the phase noise of the oscillator.

As mentioned above, voltage controlled frequency tuning of the VCOs 22, 24 and 26 may be provided by a shunt connected varactor diode circuit which includes a shunt connected varactor diode V1 and quarter wavelength tuning stub 60, a bypass compacitor 62 and an input resistor R1 coupled to an input terminal $V_{tune}$. An optional dc tuning path may be provided by a lumped inductance L1 and a lumped compacitance C1 coupled to the base of the HBT Q1.

Tuning of the HBT Q1 may be provided by a base tuning circuit, generally identified with the reference numeral 68, that is directly coupled to the base of the HBT Q1. The base tuning circuit 68 may include an inductance L2, a compacitance C2 and resistors and resistors R2 and R3 connected to a tuning terminal $V_{btune}$ and ground.

Figure 8:
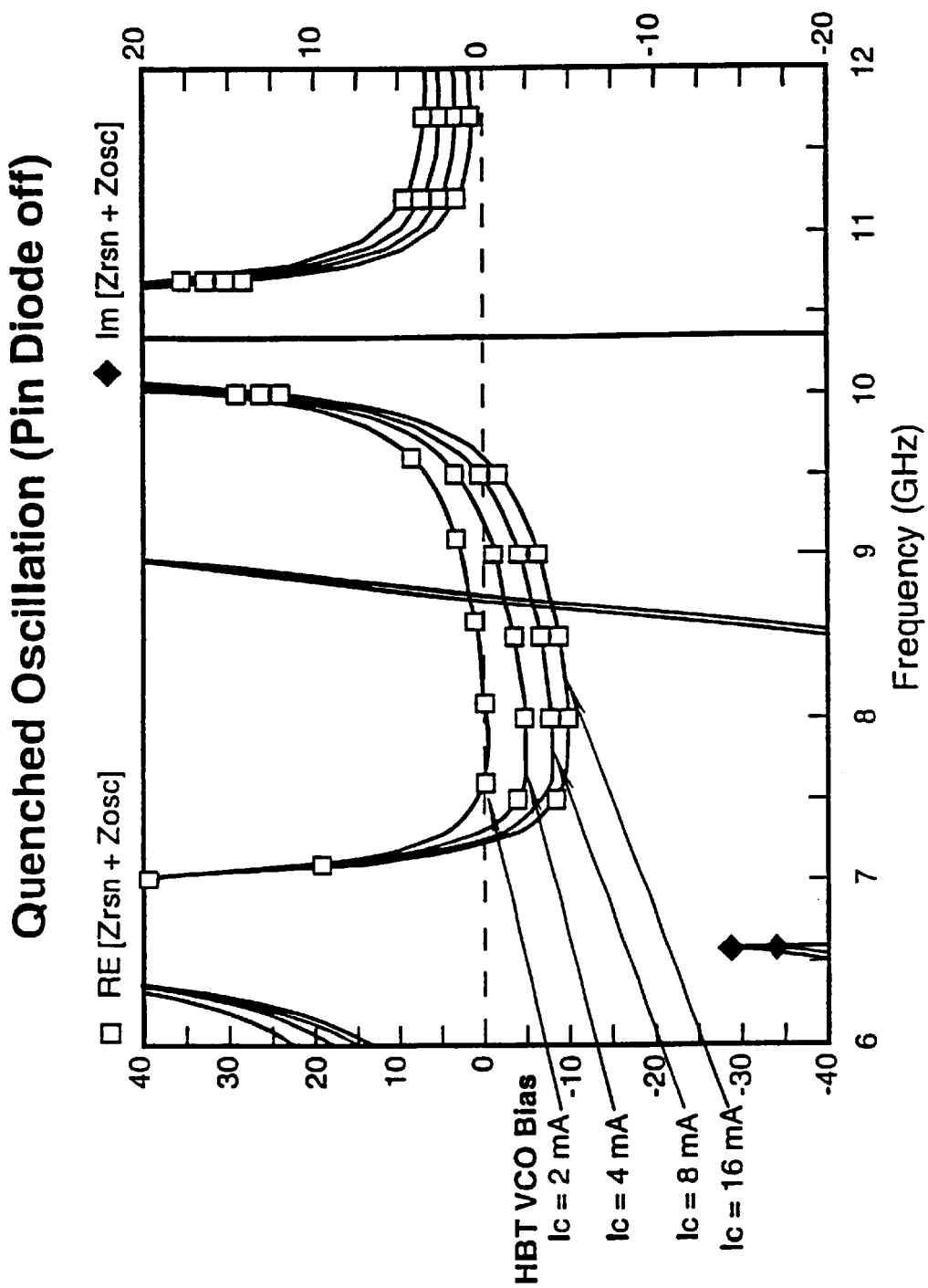
FIG. 8 is a graphical illustration of the performance of the circuit illustrated in FIG. 4 during a condition when the p-i-n diode is off.

The p-i-n diode and thus the quenching function is driven by the N-way switch 28, shown in simplified form in FIG. 3 and in more detail in FIG. 8. As will be discussed in more detail below, there are two control inputs to the N-way switch 28. A quench input $V_{quench}$ and a regulated 8 volt source VCC. The N-way switch 28 is responsive to digital logic signals ("1" and "0") to quench and unquench a VCO and simultaneously switch in the selected VCO to the power divider circuit.

Figure 7:
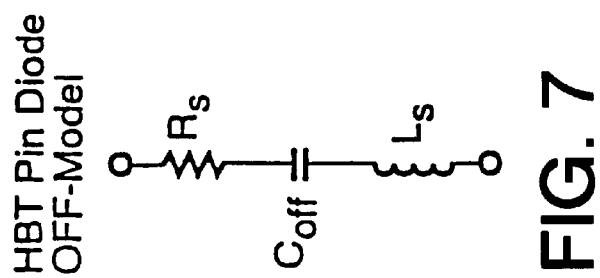
FIG. 7 is a small circuit model of the p-i-n diode illustrated in FIG. 4 during the condition when the p-i-n diode is off.
Figure 5:
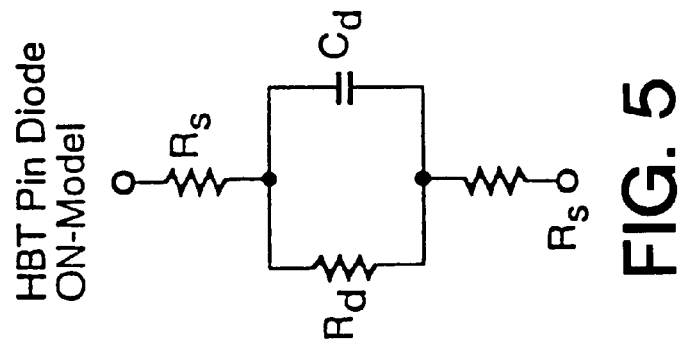
Figure 4:
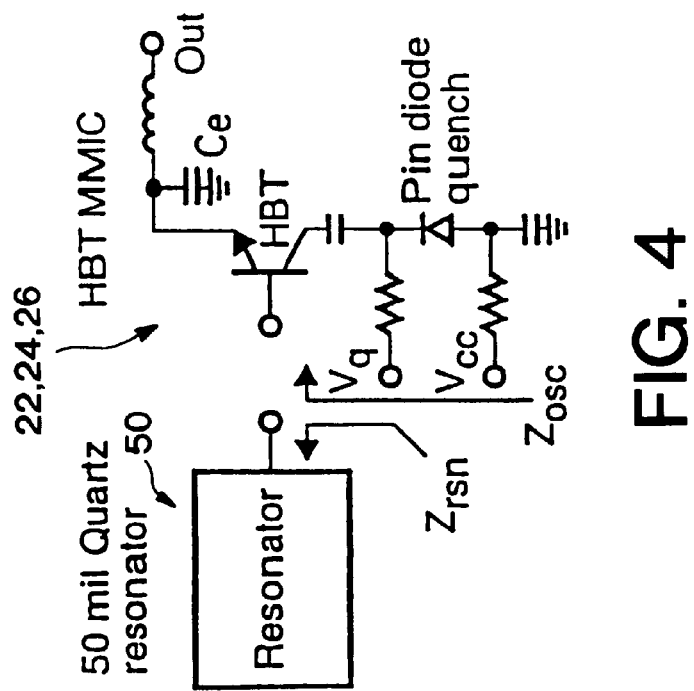
FIG. 4 is a simplified schematic quenchable VCO in accordance with the present invention.
Figure 6:
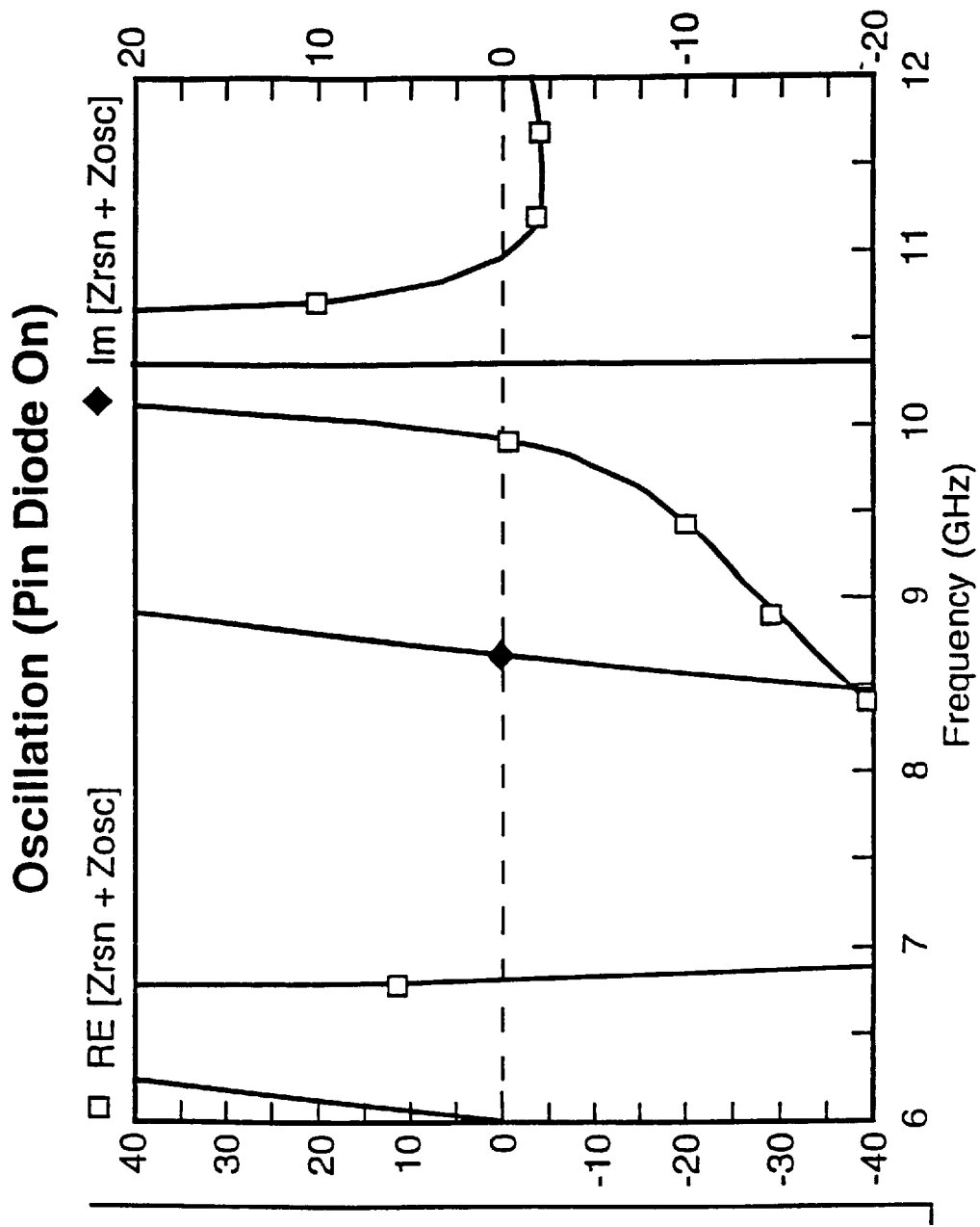

A simplified schematic diagram of the resonator circuit 50 and the quenchable VCO circuit 22, 24 and 26 is illustrated in FIG. 4 below. FIG. 5 illustrates a small circuit model of the p-i-n diode when the p-i-n diode is an ON state while FIG. 7 illustrates when the p-i-n diode is in an OFF state. FIGS. 6 and 8 illustrate the oscillation performance of the VCO circuit during conditions when the p-i-n diode is in an ON state and in a condition when the p-i-n diode is in an OFF state respectively.

Referring to FIG. 5 when the p-i-n diode is ON, the equivalent circuit includes a plurality of resistors Rs, Rs, and Rd and Cd configured as shown. The performance of the system during a condition when the p-i-n device is on for the following exemplary values is illustrated in FIG. 6: Rs=14 Ω, Cd=4 pF, Rd=$v_t$/Id, Ls=0.005 nH, pin diode=5×7.5 $\mu m^2$.

Once the p-i-n diode is switched on, the p-i-n diode shorts the collector of the HBT Q1 of AC ground, which configures the HBT Q1 with a common collector in order to enable oscillation to occur. During this condition the real and imaginary parts of the sum of the impedance Zrsn of the resonator 50 and the impedance Zosc of the VCO looking into the base of the HBT Q1 as a function of frequency is illustrated in FIG. 6. Oscillation occurs at the frequency where the imaginary part of the sum of the impedance of the resonator Zrsn and the oscillator Zosc crosses zero with a positive slope with respect to frequency and when the real part of the sum of the resonator impedance Zrsn and oscillator impedance Zosc is negative. As shown in FIG. 6, the oscillation frequency will occur at about 8.6 GHZ for the exemplary values discussed above.

The small circuit model of the p-i-n diode of the quenched VCO 22, 24 and 26 during condition when the p-i-n diode is off is illustrated in FIG. 7 and includes series coupled resistor Rs, capacitor Coff and on inductance Ls. For exemplary values as follows, the circuit performance is illustrated in FIG. 8: Rs=14 Ω, Coff=0.024 pF, Ls=0.005 nH.

During this condition, as the p-i-n diode is switched off, the p-i-n diode opens the collector of the HBT Q1 presenting a relatively high impedance which transforms the HBT Q1 from a common collector configuration where oscillation can occur to an open collector configuration where oscillation conditions are absent. By switching the p-i-n diode off, the amount of negative resistance of the sum of the resonator impedance Zrsn and oscillator impedance Zosc is greatly reduced.

FIG. 8 illustrates a small signal simulation of the oscillator start up during a condition when the p-i-n diode is an off condition. As shown, by switching the p-i-n diode off, the amount of negative resistance of the sum of the resonator impedance Zrsn and the oscillator impedance Zosc is greatly reduced shown at various HBT collectors current Ic biasing points. At some bias, the p-i-n diode adequately inhibits the negative resistance of sum of the resonator impedance Zrsn and the oscillator impedance Zosc and quenches the oscillation. By choosing a smaller p-i-n diode size, a higher open impedance can be presented to the collector of the HBT Q1 resulting in relatively effective suppression of the negative impedance condition as well as oscillation quenching at higher collector current biases.

By having the capability to switch the p-i-n diode off and on, the oscillation can be quenched and unquenched while avoiding undesirable thermal drift and settling time associated with biasing and turning the oscillator transistor on and off as a means for quenching.

Figure 9:
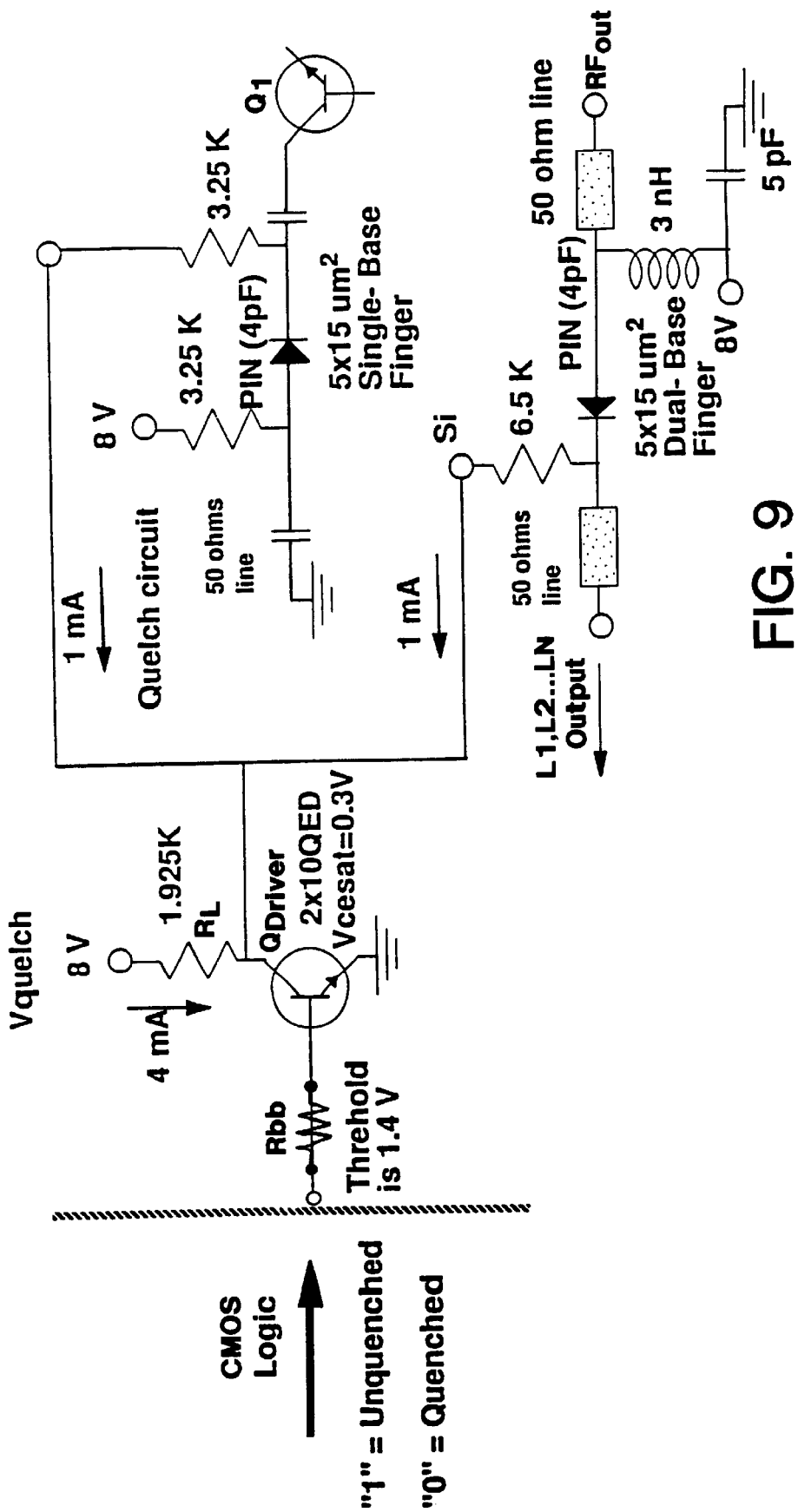
FIG. 9 is a schematic diagram of a single pole-N-throw switch utilizing the VCO quenched circuit in accordance with the present invention.

A schematic diagram of one arm of the N-way switch 28 used to drive the p-i-n diodes discussed above is illustrated in FIG. 9. As shown, a HBT transistor $Q_{driver}$ may be used to accept a a digital logic signal to either unquench or quench the desired VCO 22, 24 and 26. A base resistance $R_{bb}$ may be used to limit the current sourced to the HBT device $Q_{driver}$ as well as improve the stability of the interface which may be seen as an inductive lead or wirebond. A load resistor, $R_L$ may be coupled to the collector of the HBT transistor $Q_{driver}$ and pull down the collector voltage when the input voltage logic is greater than, for example, 1.4 volts. The positive to negative voltage excursion on the collector of the HBT transistor $Q_{driver}$ turns on the p-i-n diodes of in the VCO quench circuit illustrated in FIGS. 3 and 4 as well as selects the desired signal path of the N-way switch 28. In this way, the desired VCO 22, 24 and 26 is simultaneously unquenched and connected to the signal path of the synthesizer 20 as discussed below. The previously selected VCO 22, 24 and 26 will receive a 0 volt input and thus is quenched and correspondingly switched out of the signal path. Other unselected VCOs 22, 24 and 26 remain quenched until selected. As mentioned above, a logical "1 or high input applied to the base of the HBT $Q_{driver}$ connects the collector of the HBT Q1 forming the VCO to AC ground by turning on the p-i-n diode connected to the collector of the VCO HBT Q1 which unquenches the selected VCO.

An important aspect of the invention is that the N-way switch 28 not only allows unquenching and quenching of the VCOs but simultaneously connects the selected VCO to the single signal path. In particular, a signal path of the N-way switch of 28 is illustrated on the bottom portion of FIG. 9. It is understood that each of the VCOs in the circuit will each have a signal path. The N-way switch 28 includes a p-i-n diode in each signal path. When a logical 1 is applied to the HBT $Q_{driver}$, the p-i-n diode connected in the signal path is turned on to simultaneously connect the selected VCO output to the power splitter 20. When a logical 0 is applied to the HBT $Q_{driver}$, the p-i-n diode connected in the signal path is off, thus blocking the unselected VCO from the power splitter 20.

Obviously, many modifications and variations of the present invention are possible in light of the above teachings. Thus, it is to be understood that, within the scope of the appended claims, the invention may be practiced otherwise than as specifically described above.

We claim:

1. A switched band synthesizer having a plurality of frequency band outputs comprising:

a plurality of voltage controlled oscillators (VCO) adapted to operate at different frequencies, each of said VCOs including a transistor which includes base, emitter and collector terminals, said transistor connected in a common collector configuration, said VCO's including one or more feedback elements coupled between said base-emitter terminals forming a feedback loop, a p-i-n diode serially coupled to said collector terminal outside said feedback loop of said transistor;

means for selecting one of said plurality of VCOs, said selecting means including means for quenching unselected VCOs and unquenching selected VCOs, said selecting means also including means for switching said p-i-n diode; and coupling means for coupling the selected VCO to one of said plurality of frequency band outputs of said switched band synthesizer.

2. The switched band synthesizer as recited in claim 1, wherein said coupling means includes an N-way switch for selectively coupling the selected VCO to one of said plurality of outputs of said switched band synthesizer.

3. The switched band synthesizer as recited in claim 1, wherein said selecting means includes means for simultaneously unquenching a selected VCO and coupling the selected VCO to the output of said switched band synthesizer.

4. The switched band synthesizer as recited in claim 1, wherein said synthesizer is formed monolithically.

5. A quenchable VCO having an input terminal and an output terminal comprising:

means for generating an oscillating signal at said output terminal in response to an signal at said input terminal, said generating means including an HBT which includes a base, collector and emitter terminal, said collector terminal coupled to ground and said output terminal, said base and emitter terminals coupled together forming a feedback loop;

a p-i-n diode serially coupled to said collector terminal of said HBT outside said feedback loop, said HBT configured such that in an ON position the VCO is unquenched and in an OFF position the VCO is quenched; and means for switching said p-i-n diode on and off.

6. The quenchable VCO as recited in claim 5, wherein said switching means includes means for simultaneously turning ON the p-i-n diode and connecting the unquenched VCO to said output terminal.

7. The quenchable VCO as recited in claim 5, wherein said quenchable VCO is formed as a monolithically integrated device.

8. The quenchable VCO as recited in claim 6, wherein said switching means is responsive to a digital logic signal.

9. The switched band synthesizer as recited in claim 1, wherein said transistor a heterojunction bipolar transistor (HBT).

* * * * *